United States Patent
Stum et al.

(10) Patent No.: US 9,230,807 B2
(45) Date of Patent: Jan. 5, 2016

(54) SYSTEMS AND METHODS FOR OHMIC CONTACTS IN SILICON CARBIDE DEVICES

(71) Applicant: General Electric Company, Schenectady, NY (US)

(72) Inventors: Zachary Matthew Stum, Niskayuna, NY (US); Reza Ghandi, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 121 days.

(21) Appl. No.: 13/718,031

(22) Filed: Dec. 18, 2012

(65) Prior Publication Data
US 2014/0167068 A1     Jun. 19, 2014

(51) Int. Cl.
| | |
|---|---|
| H01L 21/02 | (2006.01) |
| H01L 21/04 | (2006.01) |
| H01L 29/45 | (2006.01) |
| H01L 29/66 | (2006.01) |
| H01L 29/78 | (2006.01) |
| H01L 29/16 | (2006.01) |

(52) U.S. Cl.
CPC ...... *H01L 21/02697* (2013.01); *H01L 21/0485* (2013.01); *H01L 29/1608* (2013.01); *H01L 29/45* (2013.01); *H01L 29/66689* (2013.01); *H01L 29/7802* (2013.01)

(58) Field of Classification Search
None
See application file for complete search history.

(56) References Cited

U.S. PATENT DOCUMENTS

| | | | |
|---|---|---|---|
| 4,544,445 A | 10/1985 | Jeuch et al. | |
| 5,510,281 A | 4/1996 | Ghezzo et al. | |
| 7,141,498 B2 | 11/2006 | Malhan et al. | |
| 8,035,112 B1* | 10/2011 | Cooper et al. | 257/77 |
| 8,188,482 B2 | 5/2012 | Treu et al. | |
| 2008/0108190 A1 | 5/2008 | Matocha | |
| 2009/0242901 A1 | 10/2009 | Matocha et al. | |
| 2010/0123172 A1* | 5/2010 | Fujikawa et al. | 257/280 |
| 2010/0210100 A1* | 8/2010 | Koyama et al. | 438/591 |
| 2011/0031507 A1* | 2/2011 | Tamaso | 257/77 |

FOREIGN PATENT DOCUMENTS

JP     10125620 A     5/1998

OTHER PUBLICATIONS

Friedrichs (NPL "Technological challenges for manufacturing power devices in SiC", CS Mantech Conference, May 14-17, 2007, Austin, Texas, USA, pp. 221-224).*
Tinani et al. (NPL "In situ real-time studies of nickel silicide phase formation", J. Vac. Sci. Technol. B 19"2 . . . , Mar./Apr. 2001, American Vacuum Society, pp. 376-383).*
Fridrichs, Peter; "Technological Challenges for Manufacturing Power Devices in SiC"; CS Mantech Conference, May 14-17, 2007, pp. 221-224.

* cited by examiner

*Primary Examiner* — Steven Loke
*Assistant Examiner* — Juanita B Rhodes
(74) *Attorney, Agent, or Firm* — John P. Darling

(57) ABSTRACT

A silicon carbide device is presented that includes a gate electrode disposed over a portion of a silicon carbide substrate as well as a dielectric film disposed over the gate electrode. The device has a contact region disposed near the gate electrode and has a layer disposed over the dielectric film and over the contact region. The layer includes nickel in portions disposed over the dielectric film and includes nickel silicide in portions disposed over the contact region. The nickel silicide layer is configured to provide an ohmic contact to the contact region of the silicon carbide device.

16 Claims, 9 Drawing Sheets

SYSTEMS AND METHODS FOR OHMIC CONTACTS IN SILICON CARBIDE DEVICES

BACKGROUND

The subject matter disclosed herein relates to silicon carbide semiconductor devices and, more specifically, to silicon carbide semiconductor devices for power applications.

During fabrication of a semiconductor device, such as a field-effect transistor (FET), one or more contacts may be formed (e.g., in a contact region of a FET device). In general, it may be desirable for a contact to have a low resistance (e.g., an ohmic contact) when constructing, for example, a contact via in a silicon carbide FET device. Additionally, during the construction of these low-resistance contacts, certain semiconductor device manufacturing techniques (e.g., lift-off technique) may lead to defects in the resulting device structure (e.g., rough edges, stringers, torn contacts, undesired excess metal, poor adhesion, and/or other forms of damage to the device). Furthermore, other device manufacturing techniques (e.g., self-aligning techniques), including methods that work well for constructing silicon devices, often do not prove to be effective for constructing silicon carbide devices.

BRIEF DESCRIPTION

In an embodiment, a silicon carbide device includes a gate electrode disposed over a portion of a silicon carbide substrate as well as a dielectric film disposed over the gate electrode. The device has a contact region disposed near the gate electrode and has a layer disposed over the dielectric film and over the contact region. The layer includes nickel in portions disposed over the dielectric film and includes nickel silicide in portions disposed over the contact region. The nickel silicide layer is configured to provide an ohmic contact to the contact region of the silicon carbide device.

In another embodiment, a silicon carbide device includes a gate electrode disposed over a portion of a silicon carbide substrate and a dielectric film disposed over the gate electrode. The device also includes a nickel layer disposed over the dielectric film. The device has a contact region disposed near the gate electrode, and the device includes one or more layers disposed over the contact region of the silicon carbide device. The one or more layers are configured to provide an ohmic contact to the contact region of the silicon carbide device, and the one or more layers include a nickel silicide layer.

In another embodiment, a method includes depositing a nickel layer on a surface of a silicon carbide device, wherein the surface of the silicon carbide device includes a contact region of the silicon carbide device and a dielectric layer. The method further includes annealing the silicon carbide device to convert a portion of the nickel layer into a nickel silicide layer including at least one nickel silicide species. Furthermore, the nickel silicide layer is configured to provide a low-resistance contact to the contact region of the silicon carbide device.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
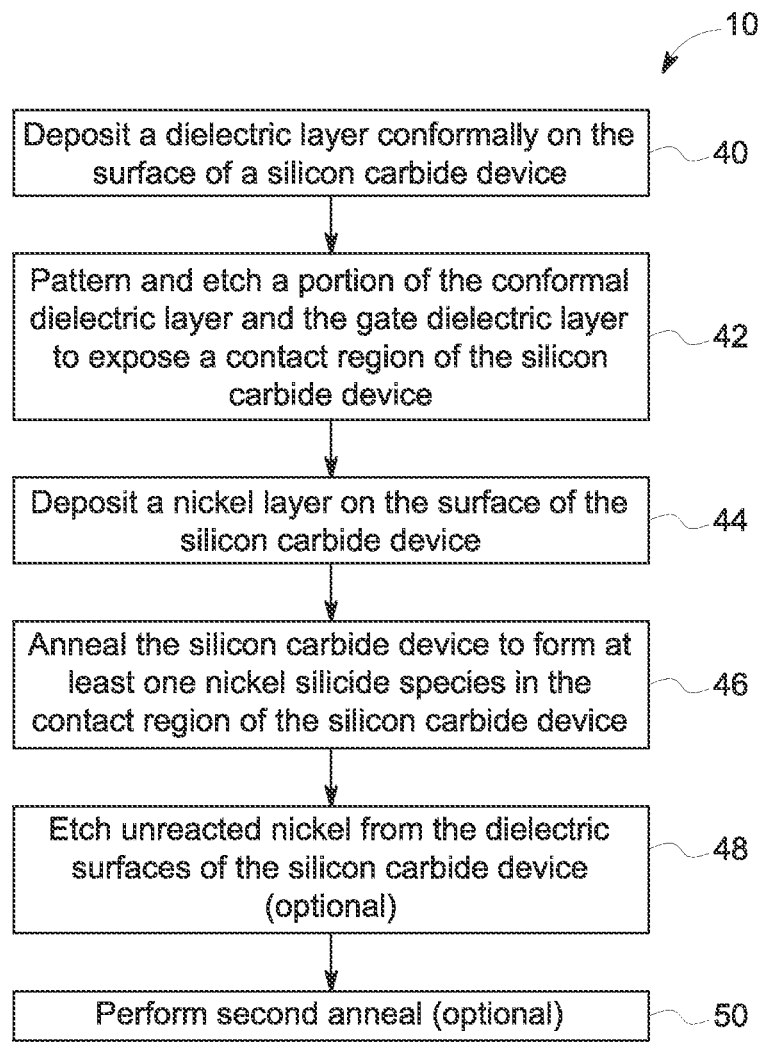
FIG. 1 is a flow diagram illustrating a method for forming a non-self-aligned ohmic contact in a silicon carbide device, in accordance with one embodiment of the present approach.

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

As set forth above, during fabrication of a semiconductor device, such as a silicon carbide FET, it may be desirable to form an ohmic contact in the contact region of the FET device. However, as mentioned, certain semiconductor manufacturing techniques (e.g., lift-off techniques, self-alignment techniques used for silicon devices, etc.) may not provide effective methods for providing the desired contact with the desired alignment when constructing silicon carbide devices.

Accordingly, presently disclosed embodiments enable the formation of an ohmic contact (e.g., for a contact via) during the construction of a silicon carbide device (e.g., a silicon carbide FET). The present technique enables only portions of a nickel layer deposited on an exposed silicon carbide surface of silicon carbide device to be converted under annealing conditions to yield a nickel silicide layer, which may provide an ohmic contact to the contact region of the silicon carbide device. Additionally, since portions of the nickel layer deposited on a dielectric surface of the silicon carbide device do not react under annealing conditions, these unreacted portions of the nickel layer may be selectively removed (e.g., via wet etching), leaving behind the nickel silicide layer in the contact region of the silicon carbide device. As set forth below, this approach may be applied to methods for constructing both non-self-aligned (e.g., according to the method 10 of FIG. 1) and self-aligned (e.g., according to the method 70 of FIG. 8) silicon carbide devices that include the nickel silicide ohmic contact. Furthermore, as set forth below, the present technique may also be applied to methods for constructing silicon carbide devices that include other metal layers (e.g., a titanium/aluminum layer) in addition to having nickel silicide disposed in the contact region of the silicon carbide device to provide an ohmic contact.

It should be appreciated that nickel generally may provide a higher contact resistance for certain silicon carbide devices (e.g., heavily-doped P+ silicon carbide layers) than other metals (e.g., titanium, aluminum, or alloys thereof). However, it should be noted that the presently disclosed ohmic contact layer comprises at least one nickel silicide species. As such, as set forth below, the properties (e.g., electrical properties, physical properties, chemical reactivity, etc.) afforded by the disclosed nickel silicide layer may be significantly improved relative to a typical nickel layer on silicon carbide. As such, through the controlled formation of nickel silicide in portions of the deposited nickel layer, the present approach may substantially improve the usefulness of nickel during the manufacture of silicon carbide devices.

With the foregoing in mind, FIG. 1 illustrates a method 10 whereby an ohmic contact may be formed on a silicon carbide device, in accordance with an embodiment of the present approach. To better illustrate the method 10, FIGS. 2-7 depict an example silicon carbide device 12, a metal-oxide semiconductor field-effect transistor (MOSFET) for power applications, at various stages during the execution of the method 10. It should be appreciated that, while the present discussion may be directed to the silicon carbide MOSFET 12, the present technique may be applicable to any MOSFET or other suitable silicon carbide devices (e.g., junction-gate field-effect transistors (JFETs)) where an ohmic contact is desired or utilized. It should be noted that the features of the MOSFET 12 illustrated in FIGS. 2-7, as well as FIGS. 9-16, are not drawn to scale.

Figure 2:
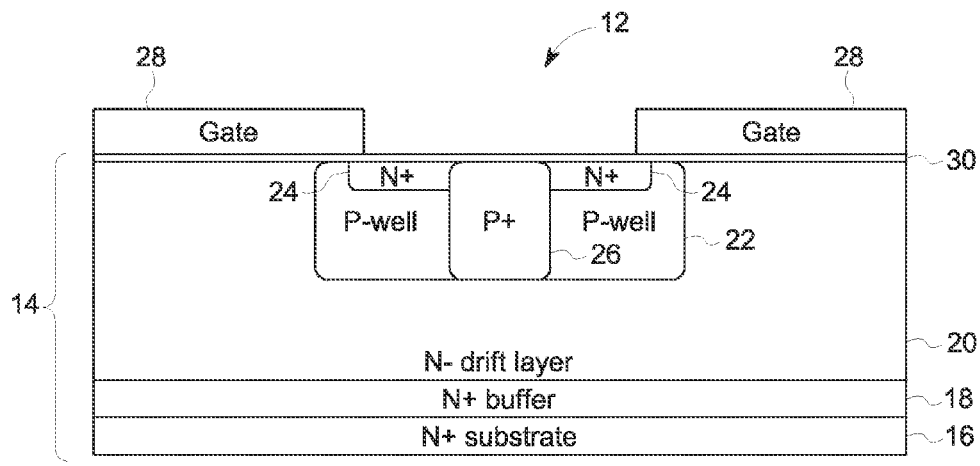
FIG. 2 is an embodiment of a metal-oxide semiconductor field-effect transistor (MOSFET) as an example of a silicon carbide device structure prior to the execution of the methods of FIG. 1 or 8.

FIG. 2 illustrates the example silicon carbide device 12 prior to the method 10. The basic structure of the MOSFET silicon carbide device 12 illustrated in FIG. 2 includes a substrate body 14 having a substrate layer (e.g., N+ SiC substrate 16) with a number of other layers disposed above, such as the N+ SiC buffer layer 18 and the N− SiC drift layer 20. Formed atop the N− SiC drift layer 20 is a P well 22, which includes two heavily-doped N+ regions 24 disposed on opposite sides of a heavily-doped P+ base 26. It should be appreciated that the silicon carbide device 12 merely provides an example device structure, and that other silicon carbide device structures (e.g., devices being oppositely doped, devices having additional or fewer layers, devices having structures of different relative dimensions, and so forth) are also presently contemplated. Additionally, as illustrated in FIG. 2, a gate (e.g., a metallic gate 28) is deposited atop portions of the substrate body 14, separated from the substrate body 14 by a relatively thin gate dielectric 30 layer.

The method 10 illustrated in FIG. 1 begins with depositing (block 40) a conformal dielectric layer on the surface of a silicon carbide device 12 illustrated in FIG. 2. The resulting structure, illustrated by the silicon carbide device 12 of FIG. 3, includes the conformal dielectric layer 52 deposited over the surface of the silicon carbide device 12. In certain embodiments, the dielectric layer 52 may include silicon dioxide, phospho-silicate glass (PSG), boro-phospho-silicate glass (BPSG), silicon nitride, or any other suitable dielectric material. Furthermore, in certain embodiments, the dielectric layer 52 may be deposited using a chemical vapor deposition (CVD) technique, a spin-coating technique, or another suitable deposition method.

Figure 3:
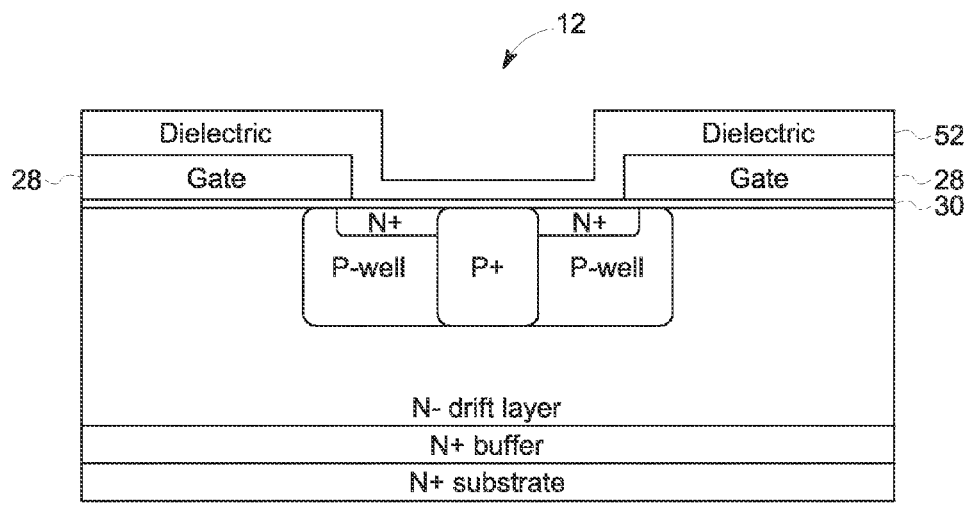
FIG. 3 is the silicon carbide device embodiment of FIG. 2 after depositing a dielectric layer, as set forth in the method of FIG. 1.
Figure 4:
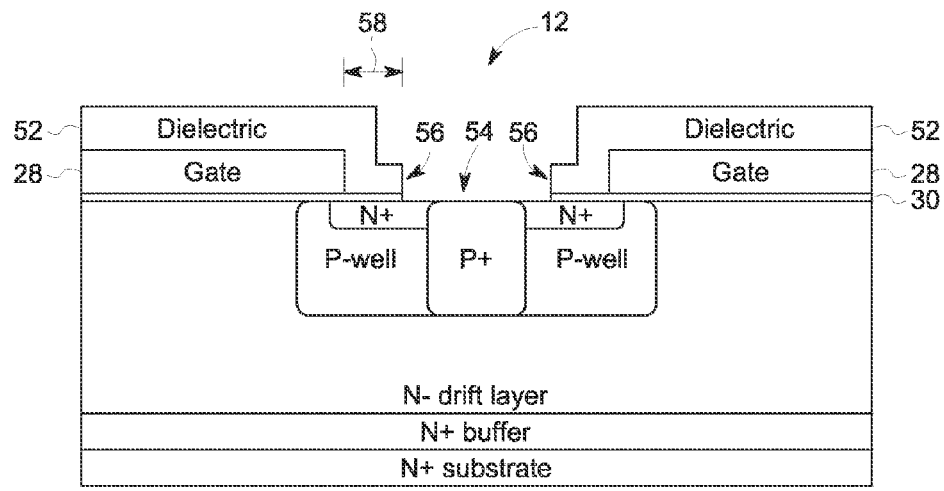
FIG. 4 is the silicon carbide device embodiment of FIG. 3 after patterning and etching the deposited dielectric layer, as set forth in the method of FIG. 1, to expose the contact region of the silicon carbide device.
Figure 5:
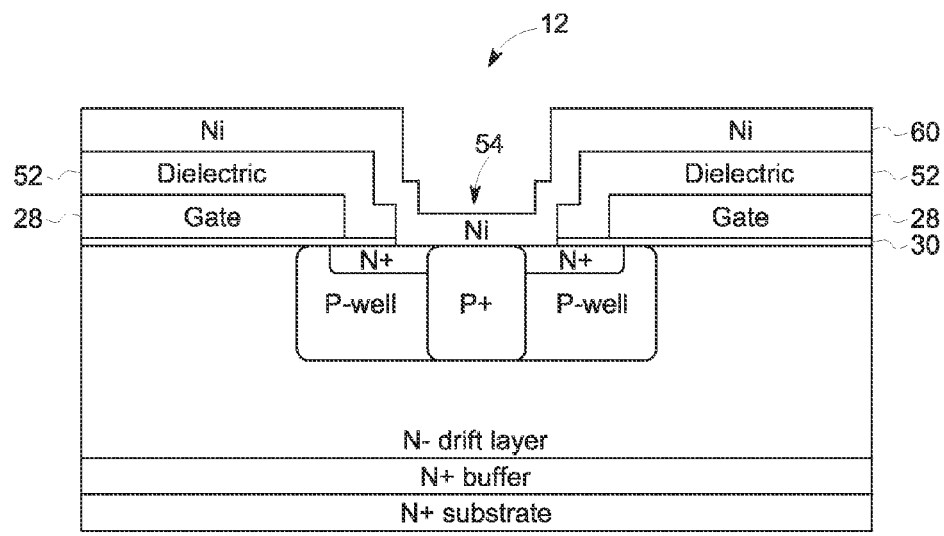
FIG. 5 is the silicon carbide device embodiment of FIG. 4 after depositing a nickel layer, as set forth in the method of FIG. 1.
Figure 6:
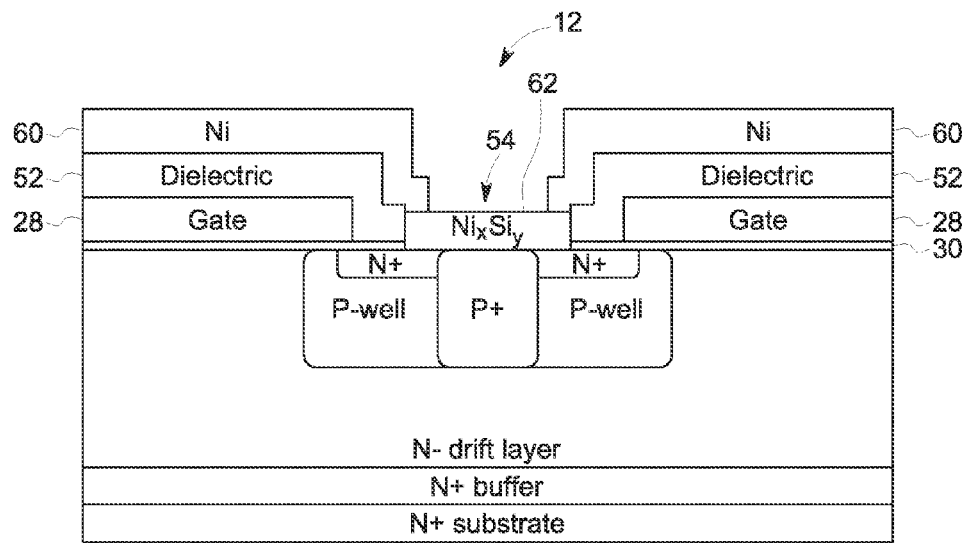
FIG. 6 is the silicon carbide device embodiment of FIG. 5 after annealing the silicon carbide device, as set forth in the method of FIG. 1, to form a nickel silicide layer.
Figure 7:
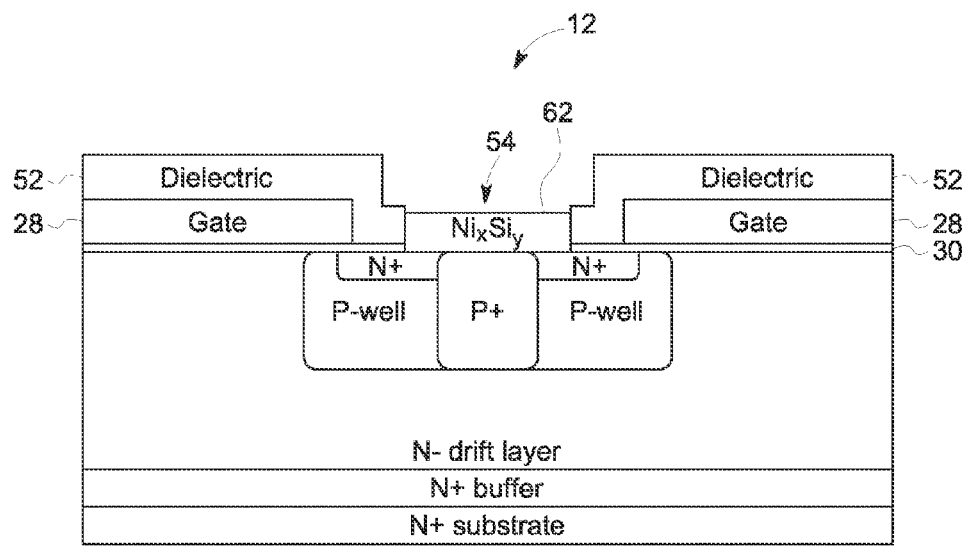
FIG. 7 is the silicon carbide device embodiment of FIG. 6 after removing the unreacted portions of the nickel layer, as set forth in the method of FIG. 1.

The method 10 illustrated in FIG. 1 continues with the patterning and etching (block 42) portions of the dielectric layer 52, as well as portions of the gate dielectric layer 30, to expose a contact region of the silicon carbide device 12. For example, using standard photolithographic techniques, a portion of the dielectric layer 52 and the gate dielectric layer 30 of the silicon carbide device 12 illustrated in FIG. 3 may be removed to expose a portion of the surface of the substrate body 14. Turning to FIG. 4, the silicon carbide device 12 of FIG. 3 is illustrated after having a portion of the dielectric layer 52 and the gate dielectric layer 30 removed to expose a contact region 54 at the surface of the substrate body 14. The contact region 54 illustrated in FIG. 4 extends from the edges 56 of the dielectric layer 52 and the gate dielectric layer 30 that are formed during the etching process. It should be appreciated that the dielectric layer 52 and the gate dielectric layer 30 extend from the gate 28 a distance 58 in order to electrically isolate the gate 28 from the contact region 54. It should further be appreciated that, in certain embodiments, the distance 58 may be greater than a distance achievable using self-aligned techniques, as discussed below with regard to FIG. 8. For example, the larger distance 58 provided by the non-self-aligned method 10 may generally allow for minor variations that may be encountered during the patterning and etching of block 42, while still providing a functional device 12.

Turning back to FIG. 1, the method 10 continues with depositing (block 44) a nickel layer on the surface of the silicon carbide device 12. That is, a nickel layer may be deposited on the surface of the dielectric layer 52 as well as the exposed contact region 54 of the silicon carbide device 12 illustrated in FIG. 4. For example, turning to FIG. 5, the silicon carbide device 12 of FIG. 4 is illustrated after having a nickel layer 60 deposited over both the surface of the dielectric layer 52 and the contact region 54. Furthermore, in certain embodiments, the nickel layer 52 may be deposited using a chemical vapor deposition (CVD) technique, sputtering, or another suitable deposition method. Accordingly, after completion of the block 44, the nickel layer 60 illustrated in FIG. 5 may generally be disposed on at least two types of surfaces: a dielectric surface (e.g., the portions of the nickel layer 60 disposed on the dielectric layer 52) and a silicon carbide surface (e.g., the portions of the nickel layer 60 disposed on the highly-doped silicon carbide contact region 54). It should be appreciated that the method 10 allows for aggressive pre-treatment reactive ion etching (RIE) or back-sputter etching to prepare the surface for metal deposition (e.g., nickel layer 60). It should further be appreciated that such aggressive etching techniques are not generally compatible with a lift-off method due to the sensitivity of the exposed photoresist surface.

Returning once more to FIG. 1, the method 10 continues with annealing (block 46) the silicon carbide device 12 to form at least one nickel silicide species in the contact region 54 of the silicon carbide device 12. That is, turning to FIG. 6, the silicon carbide device 12 may be heated such that the portion of the nickel layer 60 (e.g., deposited in block 44) may react with a portion of the silicon carbide contact region 54 to form a nickel silicide layer 62 that includes one or more nickel silicide species. For example, in certain embodiments, the silicon carbide device 12 may be heated to between approximately 300° C. and approximately 1100° C., between approximately 500° C. and approximately 900° C., or between approximately 600° C. and approximately 800° C., under a particular atmosphere (e.g., argon, nitrogen, or another suitable atmosphere). For example, in certain embodiments, the anneal of block 46 may provide a nickel silicide layer 62 having a contact resistivity that is approximately four to ten times lower than the contact resistivity of a similarly positioned nickel layer. By specific example, the contact resistivity provided by the nickel silicide layer 62 may be on the order of approximately $10^{-3}$ ohm·cm$^2$ to approximately $10^{-6}$ ohm·cm$^2$.

As mentioned, heating the silicon carbide device 12 during an anneal (e.g., set forth in block 46 of FIG. 1) may cause the formation of one or more nickel silicide species in the nickel silicide layer 62 from the nickel layer 60. While not desiring to be bound by theory, after one or more annealing steps, a continuum of nickel silicide species may exist within the nickel silicide layer 62. For example, when the nickel silicide layer 62 is formed at a lower annealing temperature (e.g., approximately 300° C. to approximately 500° C.), the resulting nickel silicide layer 62 may include a significant amount of $Ni_{31}Si_{12}$. Accordingly, for such a nickel silicide layer 62, the ratio of nickel to silicon may range between approximately 2.6 and approximately 1.0. By further example, when the nickel silicide layer 62 is formed at a higher annealing temperature (e.g., approximately 600° C. to approximately 900° C.), the resulting nickel silicide layer may including a significant amount of $Ni_2Si$. Accordingly, for such a nickel silicide layer 62, the ratio of nickel to silicon may range between approximately 2.6 and approximately 2.0. By still further example, when the nickel silicide layer 62 is formed at an even higher annealing temperature (e.g., approximately 900° C. to approximately 1100° C.), the resulting nickel silicide layer may including a significant amount of NiSi. Accordingly, for such a nickel silicide layer 62, the ratio of nickel to silicon may range between approximately 2.0 and approximately 1.0. It should further be noted that the remainder of the nickel layer 60 disposed over the dielectric layer 52 may be substantially unaltered during the annealing of block 46 while only the portion of the nickel layer 60 disposed over the contact region 54 may form the nickel silicide layer 62.

Continuing through the method 10 illustrated in FIG. 1, after annealing the silicon carbide device 12 as set forth in block 46, the unreacted nickel layer 60 (e.g., disposed over the dielectric layer 52) may be etched (block 48) from the dielectric surfaces of the silicon carbide device. However, the nickel silicide layer 62, having a different reactivity than the unreacted nickel layer 60, may remain substantially unaltered. For example, turning to FIG. 7 the silicon carbide device 12 is illustrated after the unreacted nickel layer 60 has been etched such that only the nickel silicide layer 62 remains. For example, in certain embodiments, the unreacted nickel layer 60 may be removed using a wet-etching technique. However, in other embodiments, the etching of the unreacted nickel layer 60 set forth in block 48 may not be performed such that the final device structure includes the unreacted nickel layer 60, in addition to the nickel silicide layer 62. It should be appreciated that in such embodiments, adequate care may be taken to avoid contacting the nickel layer 60 with certain other device features, such as the gate contact pad (not shown).

Additionally, as illustrated in FIG. 1, in certain embodiments, the silicon carbide device 12 maybe annealed (block 50) a second time, at a higher temperature than the first anneal, to further improve the contact resistance at the nickel silicide layer 62. For example, in certain embodiments, the silicon carbide device 12 may be heated to between approximately 800° C. to approximately 1100° C. under a particular atmosphere (e.g., argon, nitrogen, or another suitable atmosphere). As set forth above in the discussion of the first anneal, it is believed that heating the silicon carbide device 12 to a higher temperature (e.g., during the second anneal set forth in block 50) may cause the nickel silicide layer 62 (e.g., formed during the first anneal set forth in block 46) to further react with the silicon carbide contact region 54. Subsequent to the second anneal, the nickel silicide layer 62 may be richer in certain nickel silicide species (e.g., $Ni_2Si$, NiSi, etc.). For example, in certain embodiments, after the second anneal set forth in block 50, the ratio of nickel to silicon in the nickel silicide layer 62 may approach approximately 1. It should further be appreciated that the nickel silicide layer 62 formed by the second anneal of block 50 may further reduce the contact resistance at the contact region 54 of the silicon carbide device 12.

Figure 8:
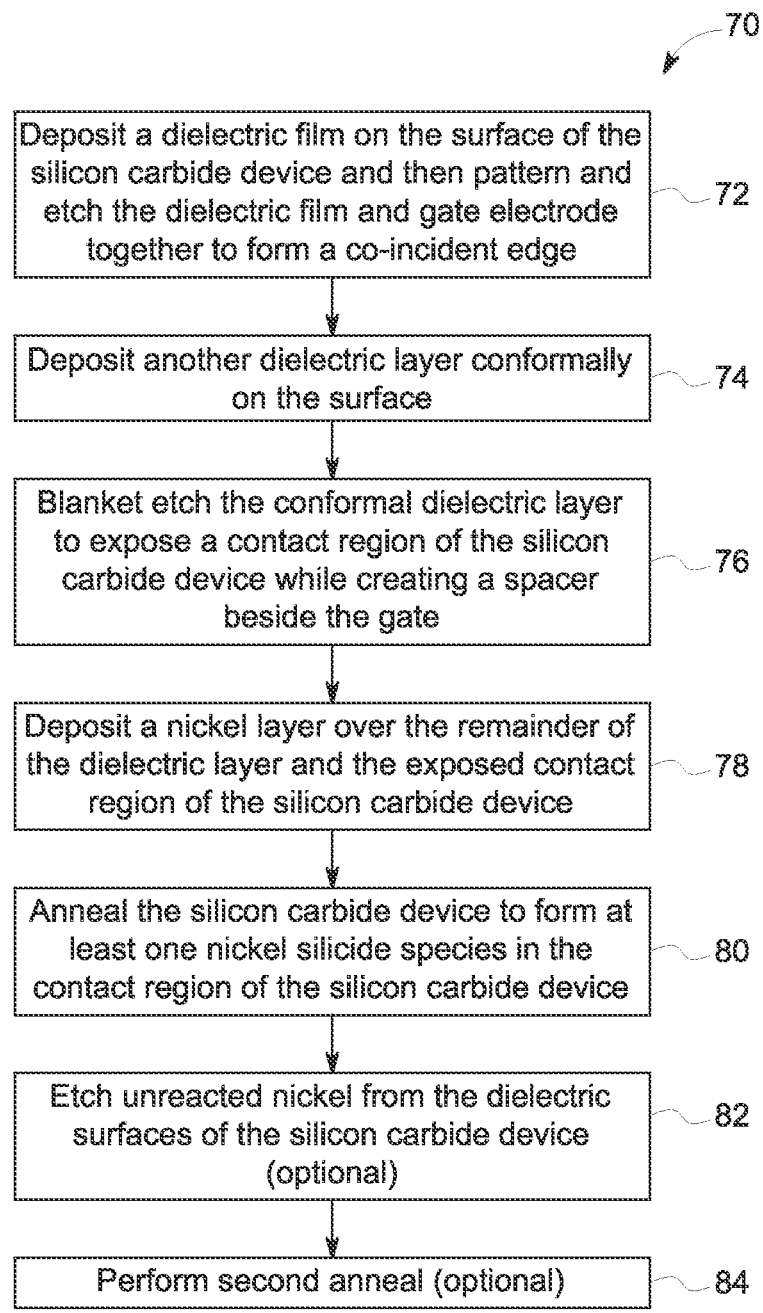
FIG. 8 is a flow diagram illustrating a method for forming a self-aligned ohmic contact in a silicon carbide device, in accordance with another embodiment of the present approach.
Figure 9:
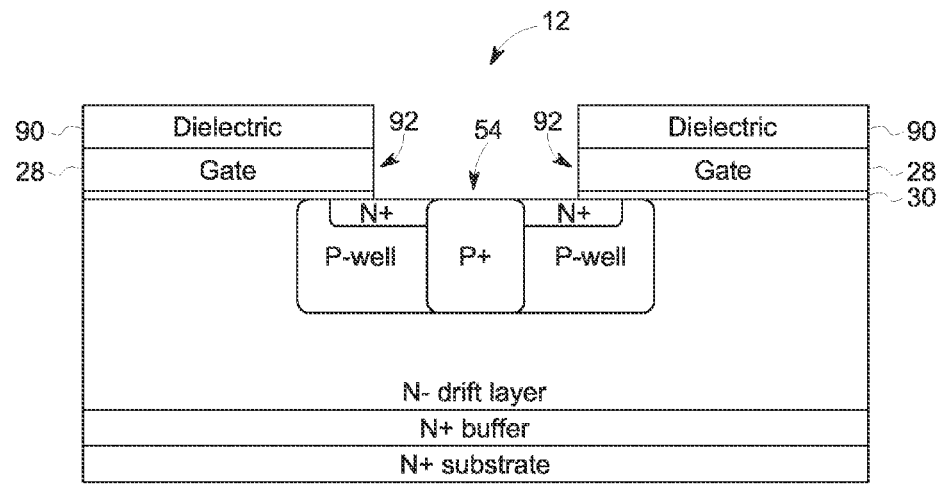
FIG. 9 is the silicon carbide device embodiment of FIG. 8 after depositing, patterning, and etching a dielectric layer along with the gate electrode layer, as set forth in the method of FIG. 8, to provide a co-incident edge.
Figure 10:
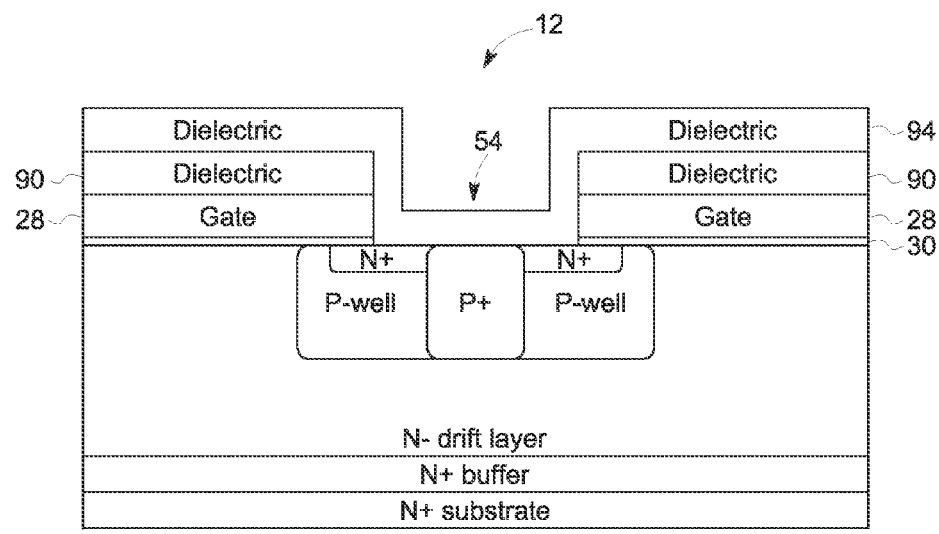
FIG. 10 is the silicon carbide device embodiment of FIG. 9 after depositing another dielectric layer, as set forth in the method of FIG. 8.

FIG. 8 illustrates a second method 70 whereby a self-aligned ohmic contact (e.g., for a contact via) may be formed on a silicon carbide device 12, in accordance with another embodiment of the present approach. To better illustrate the method 70, FIGS. 2 and 9-14 depict the same example MOSFET silicon carbide device 12 discussed above, at various stages during the execution of the method 70 illustrated in FIG. 8. It should be appreciated that, like the method 10 of FIG. 1, while the discussion of the second method 70 may be directed to the silicon carbide MOSFET 12, the present technique may be applicable to any MOSFET or other suitable silicon carbide devices. Further, FIG. 2, which is described above, illustrates an example silicon carbide device 12 prior to the execution of the method 70 illustrated in FIG. 8.

The method 70 illustrated in FIG. 8 begins with depositing (block 72) a dielectric layer on the surface of a silicon carbide device 12 illustrated in FIG. 2, followed by patterning and etching the deposited dielectric film, as well as the gate electrode, to form a co-incident edge. The resulting structure, illustrated by the silicon carbide device 12 illustrated in FIG. 9., includes a dielectric layer 90 (e.g., including silicon dioxide, phospho-silicate glass, boro-phospho-silicate glass, silicon nitride, or any other suitable dielectric material) disposed over the gate 28. Additionally, the dielectric layer 90 may be deposited using CVD, spin-coating, or another suitable deposition technique. Further, the dielectric layer 90 illustrated in FIG. 9 has been patterned and etched (e.g., using photolithographic techniques) to expose the contact region 54 of the silicon carbide device 12 and to provide a coincident edge 92.

The method 70 illustrated in FIG. 8 continues with the deposition (block 74) of another dielectric layer conformably on the surface of the silicon carbide device 12. For example, turning to FIG. 10, the silicon carbide device 12 is illustrated after the conformal deposition of the dielectric layer 94. Like the dielectric layer 90, the dielectric layer 94 may include silicon dioxide, phospho-silicate glass (PSG), boro-phospho-silicate glass (BPSG), silicon nitride, or any other suitable dielectric material. Additionally, the dielectric layer 94 may be deposited using CVD, spin-coating, or another suitable deposition technique.

Figure 11:
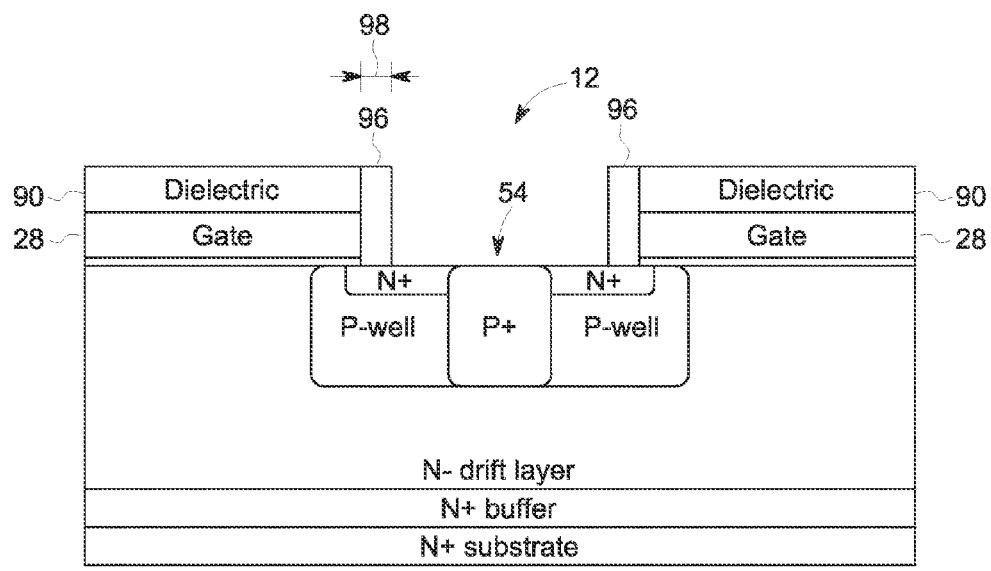
FIG. 11 is the silicon carbide device embodiment of FIG. 10 after blanket etching the silicon carbide device, as set forth in the method of FIG. 8, to provide a dielectric spacer between the gate and the exposed contact region.
Figure 12:
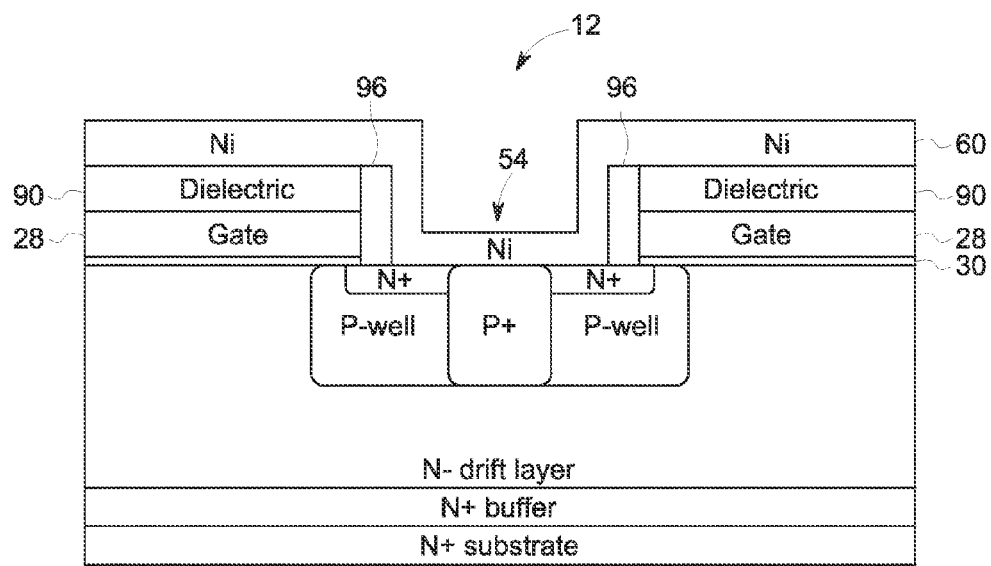
FIG. 12 is the silicon carbide device embodiment of FIG. 11 after depositing a nickel layer, as set forth in the method of FIG. 8.
Figure 13:
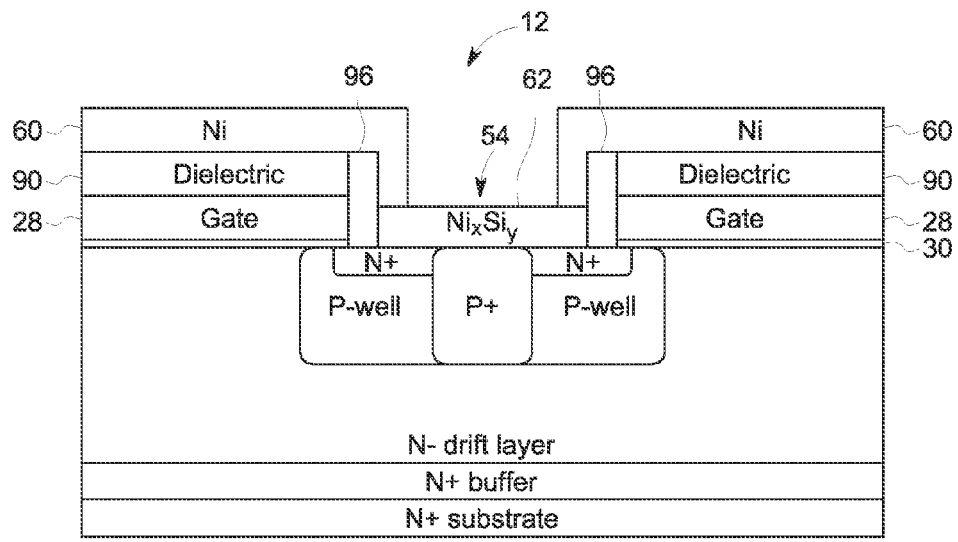
FIG. 13 is the silicon carbide device embodiment of FIG. 12 after annealing the silicon carbide device, as set forth in the method of FIG. 8, to form a nickel silicide layer.
Figure 14:
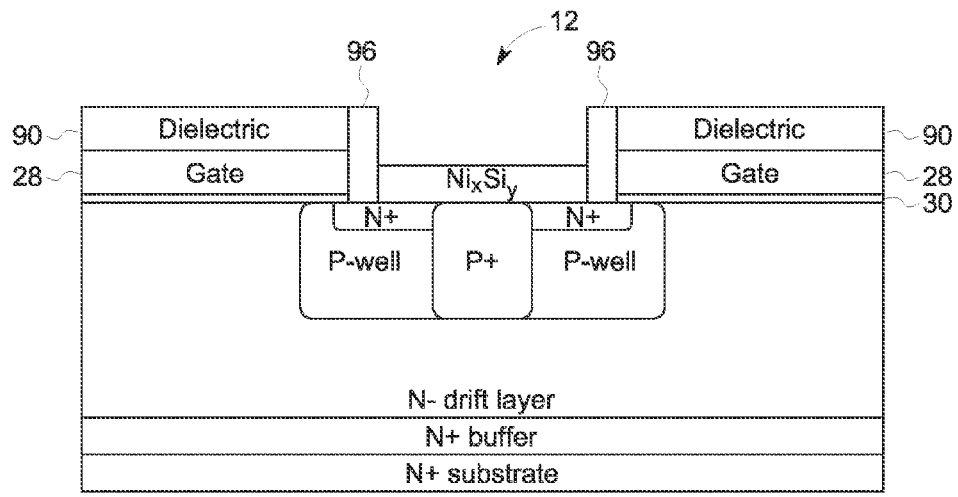
FIG. 14 is the silicon carbide device embodiment of FIG. 13 after removing the unreacted portions of the nickel layer, as set forth in the method of FIG. 8.

Returning to FIG. 8, the method 70 continues with blanket etching (block 76) of the conformal dielectric layer deposited in block 74 to create a dielectric spacer between the gate 28 and the contact region 54. For example, turning to FIG. 11, the silicon carbide device 12 is illustrated after the blanket etching (e.g., as set forth in block 76) of the dielectric layer 94 deposited in block 74. As illustrated in FIG. 11, the blanket etching, removes most of the dielectric layer 94, exposing the contact region 54, but leaving behind a spacer 96 disposed between the gate 28 and the contact region 54 of the silicon carbide device 12. It should be appreciated that, by controlling the thickness of the dielectric layer 94 deposited in block 74 and the blanket etching conditions of block 76, the width 98 of the dielectric spacer 96 may be controlled.

After formation of the dielectric spacer 96, the method 70 of FIG. 8 continues with the deposition (block 78) of a nickel layer over the surface of the silicon carbide device. For example, turning to FIG. 12 the silicon carbide device 12 is illustrated having the nickel layer 60 disposed over the surface of the silicon carbide device, including the surfaces of the remaining dielectric layer 90, the exposed contact region 54, and the dielectric spacer 96. Furthermore, in certain embodiments, the nickel layer 52 may be deposited using a chemical vapor deposition (CVD) technique, sputtering, or another suitable deposition method.

Returning to FIG. 8, once the nickel layer 60 has been deposited in block 78, the silicon carbide device 12 maybe annealed (block 80) such that at least one nickel silicide species is formed in the contact region 54 of the silicon carbide device. For example, turning to FIG. 13, the silicon carbide device 12 is illustrated after having been annealed such that a nickel silicide layer 62 is formed from the portion of the nickel layer 60 deposited over the contact region 54. For example, in certain embodiments, the silicon carbide device 12 may be heated to between approximately 300° C. and approximately 1100° C., between approximately 500° C. and approximately 900° C., or between approximately 600° C. and approximately 800° C., under a particular atmosphere (e.g., argon, nitrogen, or another suitable atmosphere). For example, in certain embodiments, the anneal of block 80 may provide a nickel silicide layer 62 having a contact resistivity that is approximately four to ten times lower than the contact resistivity of a similarly positioned nickel layer. By specific example, the contact resistivity provided by the nickel silicide layer 62 may be on the order of approximately $10^{-3}$ to approximately $10^{-6}$ ohm·cm$^2$.

As mentioned above, heating the silicon carbide device 12 during an anneal (e.g., set forth in block 80 of FIG. 8) may cause the formation of one or more nickel silicide species in the nickel silicide layer 62 from the nickel layer 60. For example, when the nickel silicide layer 62 is formed at a lower annealing temperature (e.g., approximately 300° C. to approximately 500° C.), the resulting nickel silicide layer 62 may include a significant amount of $Ni_{31}Si_{12}$. Accordingly, for such a nickel silicide layer 62, the ratio of nickel to silicon may range between approximately 2.6 and approximately 1.0. By further example, when the nickel silicide layer 62 is formed at a higher annealing temperature (e.g., approximately 600° C. to approximately 900° C.), the resulting nickel silicide layer may including a significant amount of $Ni_2Si$. Accordingly, for such a nickel silicide layer 62, the ratio of nickel to silicon may range between approximately 2.6 and approximately 2.0. By still further example, when the nickel silicide layer 62 is formed at an even higher annealing temperature (e.g., approximately 900° C. to approximately 1100° C.), the resulting nickel silicide layer may including a significant amount of NiSi. Accordingly, for such a nickel silicide layer 62, the ratio of nickel to silicon may range between approximately 2.0 and approximately 1.0. It should further be noted that the remainder of the nickel layer 60 disposed over the dielectric layer 90 and/or the dielectric spacer 96 may be substantially unaltered during the annealing of block 46 while only the portion of the nickel layer 60 disposed over the contact region 54 may form the nickel silicide layer 62.

Continuing through the method 70 illustrated in FIG. 8, after the anneal set forth in block 80, the unreacted portions of the nickel layer 60 may be etched (block 82) from the dielectric surfaces (e.g., the dielectric layer 90 and the dielectric spacer 96) while leaving the nickel silicide layer 62 substantially unaffected. For example, turning to FIG. 14, the silicon carbide device 12 is illustrated after the unreacted nickel layer 60 has been removed (e.g., using a wet etching technique), leaving behind only the nickel silicide layer 62. In the structure of the silicon carbide device 12 illustrated in FIG. 14, the nickel silicide layer 62 is self-aligned relative to the gate 28 and/or the contact region 54 by the spacer 96. It should be appreciated that the width 98 of the dielectric spacer 96 may generally be less than the spacing between the gate and the nickel silicide layer that may be achieved using other alignment methods (e.g., less than the width 58 illustrated in FIG. 4 for the non-self-aligned method 10 illustrated in FIG. 1). It should be appreciated that, in other embodiments, the etching of the unreacted nickel layer 60 set forth in block 82 may not be performed such that the final device structure includes the unreacted nickel layer 60, in addition to the nickel silicide layer 62. It should be appreciated that in such embodiments, adequate care may be taken to avoid contacting the nickel layer 60 with certain other device features, such as the gate contact pad (not shown).

Returning once more to FIG. 8, in certain embodiments, the method 70 continues with a second anneal being performed (block 84) on the silicon carbide device 12. That is, after the unreacted nickel layer 60 has been removed as set forth in block 82, the silicon carbide device 12 illustrated in FIG. 14 may be annealed a second time, at a higher temperature than the first anneal set forth in block 80. For example, in certain embodiments, the silicon carbide device 12 may be heated to between approximately 800° C. to approximately 1100° C. under a particular atmosphere (e.g., argon, nitrogen, or another suitable atmosphere). Again, while not desiring to be bound by theory, it is believed that heating the silicon carbide device 12 to a higher temperature (e.g., during the second anneal set forth in block 84) may cause the nickel silicide layer 62 that is formed during the first anneal (e.g., set forth in block 80) to further react with the silicon carbide contact region 54 to form other nickel silicide species (e.g., $Ni_2Si$, NiSi, etc.), in which the ratio of nickel to silicon in the nickel silicide layer 62 may approach approximately 1.0. It should further be appreciated that the nickel silicide layer 62 formed by the second anneal of block 80 may further reduce the contact resistance at the contact region 54 of the silicon carbide device 12.

Figure 15:
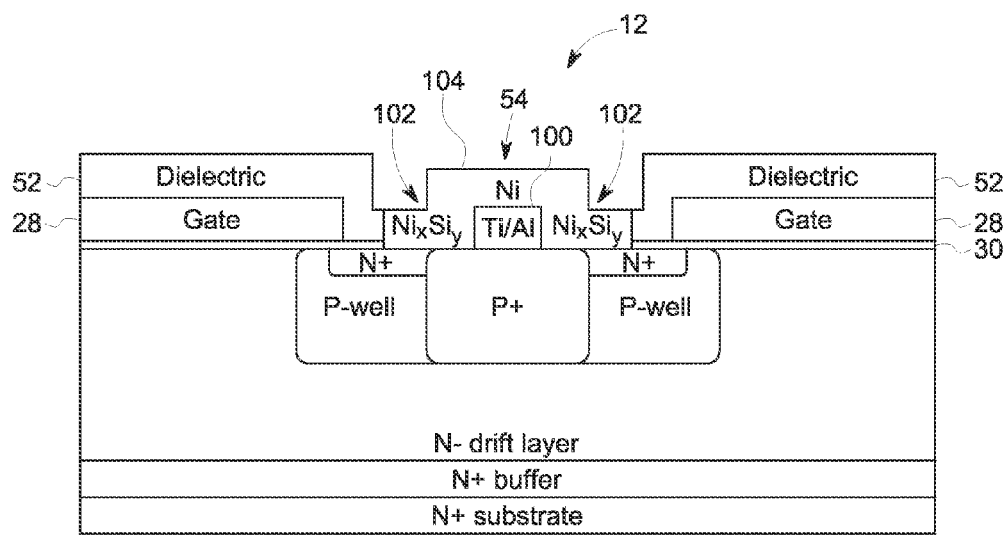
FIG. 15 is an alternative embodiment of a non-self-aligned MOSFET silicon carbide device having a titanium/aluminum layer, in addition to the nickel silicide layer, disposed in the contact region of the silicon carbide device.

FIG. 15 illustrates an alternative embodiment of a non-self-aligned silicon carbide device 12 that includes a titanium/aluminum layer 100 disposed over a portion of the contact region 54. More specifically, the titanium/aluminum layer 100 is disposed on the P+ base 32 of the silicon carbide device 12, while a nickel silicide 102 is disposed over the remainder of the contact region 54. Furthermore, the portion of the nickel layer 104 remains disposed over the titanium/aluminum layer 100. The silicon carbide device 12 illustrated in FIG. 15 may be manufactured using a non-self-aligned method (e.g., similar to the method 10 illustrated in FIG. 1), but including steps to selectively deposit the titanium/aluminum layer 100 in the middle of the contact region 54 prior to the deposition of the nickel layer (e.g., between blocks 42 and 44 of the method 10 illustrated in FIG. 1).

Figure 16:
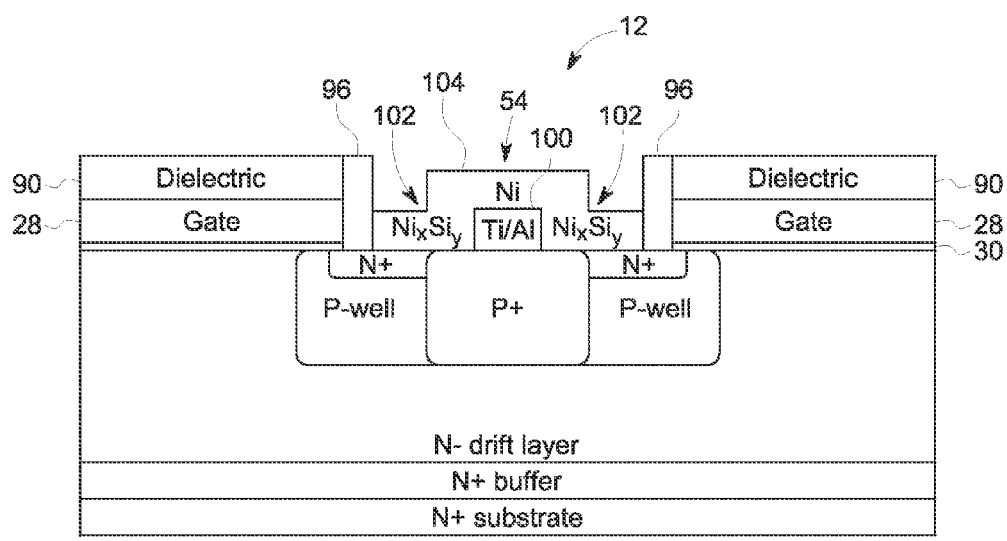
FIG. 16 is an alternative embodiment of a self-aligned MOSFET silicon carbide device having a titanium/aluminum layer, in addition to the nickel silicide layer, disposed in the contact region of the silicon carbide device.

FIG. 16 illustrates an alternative embodiment of a self-aligned silicon carbide device 12 that also includes the titanium/aluminum layer 100 disposed over a portion of the contact region 54. Like the device illustrated in FIG. 15, the silicon carbide device 12 illustrated in FIG. 16 includes a titanium/aluminum layer 100 disposed over the P+ base 32 of the silicon carbide device 12, while nickel silicide 102 is disposed over the remainder of the contact region 54. Furthermore, like the device of FIG. 15, a portion of the nickel layer 104 remains disposed over the titanium/aluminum layer 100. The silicon carbide device 12 illustrated in FIG. 16 may be manufactured using a self-aligned method (e.g., like the method 70 illustrated in FIG. 8), but including steps to selectively deposit the titanium/aluminum layer 100 in the middle of the contact region 54 prior to the deposition of the nickel layer (e.g., between blocks 76 and 78 of the method 70 illustrated in FIG. 8).

Technical effects of the presently disclosed technique include the facile formation of an ohmic contact for a silicon carbide device. That is, the present technique enables only portions of the nickel layer deposited on a silicon carbide surface to be converted to the nickel silicide under annealing conditions to provide the ohmic contact (e.g., in the contact region of a silicon carbide field-effect transistor (FET) device). Further, since the conditions of the anneal do not provoke portions of the nickel layer deposited on a dielectric surface to react or form nickel silicide, these unreacted portions of the deposited nickel layer may be easily and selectively removed (e.g., via wet etching) such that only the nickel silicide remains in the contact region of the silicon carbide device. The present technique may be applied to methods for constructing both non-self-aligned (e.g., according to the method 10 of FIG. 1) and self-aligned (e.g., according to the method 70 of FIG. 8) silicon carbide devices that include the nickel silicide ohmic contact. It should further be appreciated that using the disclosed approach with a self-aligning technique (e.g., as set forth in the method 70 of FIG. 8) may enable higher device densities (e.g., smaller cell pitches) and improved device yields. Furthermore, the present technique may be applied to methods for constructing silicon carbide devices that include other metal layers (e.g., the titanium/aluminum layer 100 illustrated in FIGS. 15 and 16) in addition to having nickel silicide disposed in the contact region of the silicon carbide device to provide an ohmic contact.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A silicon carbide device, comprising:
a gate electrode disposed over a portion of a silicon carbide substrate;
a dielectric film disposed over the gate electrode;
a contact region of the silicon carbide device disposed near the gate electrode, the contact region including a base of a well of the silicon carbide substrate, the base of the well being doped with a first conductivity type, and two regions on opposite sides of the base of the well, the two regions being doped with a second conductivity type opposite the first conductivity type; and
a layer disposed over the dielectric film and over the contact region extending at least across the base of the well and across at least portions of each of the two regions on opposite sides of the base of the well, wherein the layer comprises nickel in portions disposed over the dielectric film and wherein the layer comprises nickel silicide in portions disposed over an entirety of an upper surface of the base of the well and in direct contact with the upper surface of the base of the well in the contact region, and wherein the layer of the nickel silicide is configured to provide an ohmic contact to the contact region of the silicon carbide device.

2. The device of claim 1, wherein the layer of the nickel silicide is disposed near the gate electrode and separated from the gate electrode by a dielectric spacer.

3. The device of claim 2, wherein the dielectric spacer is configured to self-align the layer of the nickel silicide to the contact region and to the gate electrode of the silicon carbide device.

4. The device of claim 1, wherein the layer of the nickel silicide comprises $Ni_{31}Si_{12}$, $Ni_2Si$, NiSi, or a combination thereof.

5. The device of claim 1, wherein the ohmic contact has a contact resistivity less than $10^{-3}$ ohm·cm².

6. The device of claim 5, wherein the ohmic contact has a contact resistivity less than $10^{-6}$ ohm·cm².

7. The device of claim 1, wherein the silicon carbide device is a silicon carbide power device.

8. The device of claim 1, wherein the silicon carbide device is a silicon carbide MOSFET or JFET device.

9. A silicon carbide device, comprising:
a gate electrode disposed over a portion of a silicon carbide substrate;
a dielectric film disposed over the gate electrode;
a nickel layer disposed over the dielectric film;
a contact region of the silicon carbide device disposed near the gate electrode, the contact region including a base of a well of the silicon carbide substrate, the base being doped with a first conductivity type, and two regions on opposite sides of the base, the two regions being doped with a second conductivity type opposite the first conductivity type; and one or more layers disposed over the contact region of the silicon carbide device, wherein the one or more layers are configured to provide an ohmic contact to the contact region of the silicon carbide device, wherein the one or more layers comprise a nickel silicide layer, wherein the nickel silicide layer extends over an entirety of an upper surface of the base of the well and directly contacts the upper surface of the base of the well and across at least portions of each of the two regions on opposite sides of the base of the well.

10. The device of claim 9, wherein the contact region is configured to be spaced a distance away from the gate electrode.

11. The device of claim 10, comprising a dielectric spacer disposed between the gate electrode and the contact region, wherein the dielectric spacer is configured to self-align the contact region relative to the gate electrode.

12. The device of claim 11, wherein the dielectric spacer is configured to self-align a contact via relative to the contact region of the silicon carbide device.

13. The device of claim 9, wherein a nickel to silicon ratio of the nickel silicide layer comprises between approximately 2.6 and approximately 1.0.

14. The device of claim 13, wherein the nickel to silicon ratio of the nickel silicide layer comprises between approximately 2.6 and approximately 2.0.

15. The device of claim 13, wherein the nickel to silicon ratio of the nickel silicide layer comprises between approximately 2.0 and approximately 1.0.

16. The device of claim 9, wherein the silicon carbide device is a silicon carbide metal-oxide semiconductor field-effect transistor (MOSFET) or unction-gate field-effect transistor (JFET) power device.

* * * * *